United States Patent
Khandelwal et al.

(10) Patent No.: US 11,492,364 B2
(45) Date of Patent: Nov. 8, 2022

(54) SILICON HYDRAZIDO PRECURSOR COMPOUNDS

(71) Applicant: ENTEGRIS, INC., Billerica, MA (US)

(72) Inventors: Manish Khandelwal, Danbury, CT (US); Thomas H. Baum, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/836,444

(22) Filed: Mar. 31, 2020

(65) Prior Publication Data

US 2021/0300952 A1    Sep. 30, 2021

(51) Int. Cl.
*C07F 7/10* (2006.01)
*B05D 1/00* (2006.01)

(52) U.S. Cl.
CPC .......... *C07F 7/10* (2013.01); *B05D 1/60* (2013.01); *B05D 1/62* (2013.01); *B05D 2202/25* (2013.01); *B05D 2202/30* (2013.01); *B05D 2202/45* (2013.01); *B05D 2203/30* (2013.01)

(58) Field of Classification Search
CPC .... C07F 7/10; B05D 1/60; B05D 1/62; B05D 2202/25; B05D 2202/30; B05D 2202/45; B05D 2203/30
See application file for complete search history.

(56) References Cited

U.S. PATENT DOCUMENTS

| | | | |
|---|---|---|---|
| 7,910,765 B2 | 3/2011 | Wang | |
| 9,443,736 B2 | 9/2016 | Cameron | |
| 9,783,558 B2 | 10/2017 | Wang | |
| 10,526,701 B2 | 1/2020 | Kumar | |
| 2004/0096582 A1* | 5/2004 | Wang | H01L 21/02222 556/412 |
| 2005/0080286 A1* | 4/2005 | Wang | C07F 7/10 556/410 |
| 2006/0258173 A1 | 11/2006 | Xiao | |
| 2007/0004931 A1* | 1/2007 | Xiao | C07F 7/10 556/413 |
| 2008/0081106 A1 | 4/2008 | Wang | |
| 2010/0041243 A1* | 2/2010 | Cheng | C23C 16/345 546/14 |
| 2019/0088474 A1* | 3/2019 | MacDonald | H01L 21/0217 |
| 2019/0267383 A1 | 8/2019 | Rocklein | |

FOREIGN PATENT DOCUMENTS

WO    WO-2005038871 A2 *    4/2005    ............. C07F 7/025

OTHER PUBLICATIONS

V. Rakhlin et al., 388 Doklady Chemistry, 47-49 (2003) (Year: 2003).*
By I. Gronde et al., 27 Dalton Transactions, 5300-5309 (2009) (Year: 2009).*
U. Wannagat et al., 96 Monatshefte fuer Chemie, 1902-1908 (1965) (Year: 1965).*
CAS Abstract and Indexed Compounds, U. Wannagat, 96 Monatshefte fuer Chemie, 1902-1908 (1965) (Year: 1965).*
CAS Abstract and Indexed Compounds, Z Sergeeva et al., 30 Zhurnal Obshchei Khimii, 694-695(1960) (Year: 1960).*
H. Niederpruem et al., 311 Zeitschriftfuer Anorganische und Allgemeine Chemie, 270-280 (1961) (Year: 1961).*
CAS Abstract and Indexed Compounds, H. Niederpruem et al., 311 Zeitschrift fuer Anorganische und Allgemeine Chemie, 270-280 (1961) (Year: 1961).*
A. Jana et al., 28 Organometallics, 6574-6577 (2009) (Year: 2009).*
Z Sergeeva et al., 30 Zhurnal Obshchei Khimii, 694-695 (1960) (Year: 1960).*
T. Smirnova et al., Inorganic Materials, vol. 39, No. 2, 2003, pp. 117-122. Translated from Neorganicheskie Materialy, vol. 39, No. 2, 2003, pp. 163-169 (Year: 2003).*
V. Rakhlin et al., Doklady Chemistry, vol. 388, Nos. 4-6, 2003, pp. 47-49. Translated from Doklady Akademii Nauk, vol. 388, No. 6 , 2003, pp. 761-763. (Year: 2003).*
T. Smirnova et al., 429 Thin Sold Films, 144-151 (2003) (Year: 2003).*
T. Smirnova et al., 44 Journal of Structural Chemistry, 169-173 (2003) (Year: 2003).*
Mitzel, NW; Simple Silylhydrazines as Models for Si—N β-Donor Interactions in SiNN Units; Chemistry, vol. 4, Issue 4, pp. 692-698; Apr. 16, 1998 (Abstract only).
R. G. Mirskov, V. I. Rakhlin, S. N. Adamovich, O. S. Makarova and M. G. Voronkov, "Organosilicon Derivatives of 1,1-Dimethylhydrazine", Chemistry for Sustainable Development 15 (2007) 1-9.

* cited by examiner

*Primary Examiner* — Alexander R Pagano

(57) ABSTRACT

Provided are certain silicon precursor compounds which are useful in the formation of silicon-containing films in the manufacture of semiconductor devices, and more specifically to compositions and methods for forming such silicon-containing films, such as films comprising silicon, silicon nitride, silicon oxynitride, silicon dioxide, a carbon-doped silicon nitride, or a carbon-doped silicon oxynitride film.

18 Claims, No Drawings

SILICON HYDRAZIDO PRECURSOR COMPOUNDS

FIELD OF THE INVENTION

In general, the invention relates to methods and precursors for the deposition of silicon-containing films onto microelectronic device surfaces.

BACKGROUND OF THE INVENTION

In semiconductor manufacturing, thin (e.g., <1000 nanometers thickness) passive layers of chemically inert dielectric materials, such as silicon nitride ($Si_3N_4$), silicon oxynitride ($SiO_xN_y$), silicon carbide (SiC), silicon carbon nitride (SiCN) and silicon carbo oxide (SiCO) and/or silicon dioxide ($SiO_2$) are widely employed in microelectronic device structures, to function as structural elements of the multilayered device such as sidewall spacer elements, diffusion masks, oxidation barriers, trench isolation coatings, intermetallic dielectric materials, passivation layers, insulators and etch-stop layers.

Deposition of silicon-containing films by chemical vapor deposition techniques is a highly attractive methodology for forming such films. CVD processes involving low deposition temperatures are particularly desired, e.g., temperatures less than about 450° C., but require the availability of suitable silicon precursor compounds for such purpose. In some cases, higher deposition temperatures can be considered, when the thermal budget of the integrated circuit will allow. In these cases, temperatures >450° C. might be utilized to achieve the desired dielectric film.

Silicon nitride (SiN) has been used for source and drain spacer (S/D spacer) for FinFET and gate-all-around (GAA) structures due to its high wet etch and $O_2$ ashing resistance. Unfortunately, SiN has a high dielectric constant (k) of about 7.5. Carbon and nitrogen doped $SiO_2$ (SiCON) spacer has been developed to reduce the dielectric constant and maintain excellent etch and ashing resistance during post-deposition processing. Currently, the best etch and ashing resistive SiCON dielectrics have a k value of around 4.0. Etch and ashing resistive dielectrics with a k value of <3.5 are needed for next generation devices.

Additionally, there remains a need for improved organosilicon precursors and processes for the formation of silicon-containing films in the manufacture of microelectronic devices, particularly in processes utilizing low temperature vapor deposition techniques for the formation of silicon nitride, silicon dioxide, and silicon oxynitride films. In particular, there is a need for liquid silicon precursors with good thermal stability, high volatility, and reactivity with a substrate surface.

SUMMARY OF THE INVENTION

The invention relates generally to the formation of silicon-containing films in the manufacture of semiconductor devices, and more specifically to compositions and methods for forming such silicon-containing films, such as films comprising silicon, silicon nitride, silicon oxynitride, silicon dioxide, carbon-doped silicon nitride or silicon oxide, or carbon-doped silicon oxynitride film, at relatively low temperatures.

Compounds of Formula (I) as set forth herein are useful as precursor compounds in the formation of such various silicon-containing films. Vapor deposition conditions and processes can be utilized with these precursor compounds to form the silicon-containing films, including processes such as chemical vapor deposition (CVD), atomic layer deposition (ALD), plasma-enhanced ALD (PEALD), plasma enhanced cyclical chemical vapor deposition (PECCVD), a flowable chemical vapor deposition (FCVD), a plasma-enhanced ALD-like process, or an ALD process with oxygen-containing reactants, a nitrogen-containing reactant, or a combination thereof.

DETAILED DESCRIPTION OF THE INVENTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g. 1 to 5 includes 1, 1.5, 2, 2.75, 3, 3.80, 4 and 5).

In a first aspect, the invention provides a compound of Formula (I):

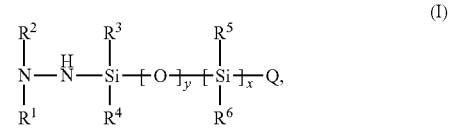

wherein $R^1$ and $R^2$ are independently chosen from $C_1$-$C_4$ alkyl, phenyl, substituted phenyl, or $C_4$-$C_6$ cycloalkyl, or can be taken together with the nitrogen atom to which they are bound to form a $C_3$-$C_5$ nitrogen containing ring; $R^3$ and $R^4$ are independently chosen from hydrogen and $C_1$-$C_4$ alkyl, or are taken together with the Si atom to which they are bound to form a $C_3$-$C_5$ silicon-containing ring; and $R^5$ and $R^6$ are independently chosen from hydrogen and $C_1$-$C_4$ alkyl;

Q is chosen from chloro, bromo, iodo, or a group of the formula

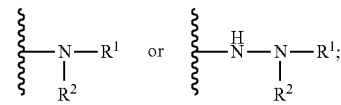

and
x is 0 or 1, and
(i) y is 0, provided that when y is 0, Q is other than a group of the formula

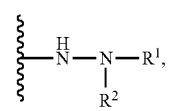

(ii) y is 1 when x is 1.

As used herein, the term "substituted phenyl" represent phenyl groups containing as substituents one or two of $C_1$-$C_4$ alkyl, $C_1$-$C_4$ alkoxy, $C_1$-$C_4$ alkoxy carbonyl, $C_1$-$C_4$ alkanoyloxy, $C_1$-$C_4$ alkanoylamino, halogen, carboxy, nitro, hydroxy, $C_1$-$C_4$ alkylene-OH, $C_1$-$C_4$ alkylene-$CO_2$ $R_7$, —$OC_1$-$C_4$ alkylene-OH, or —$OC_1$-$C_4$ alkylene-$CO_2$ $R_7$, wherein $R_7$ is a $C_1$-$C_6$ alkyl group.

In one embodiment, each of $R^1$, $R^2$, $R^3$, $R^4$, $R^5$ and $R^6$ are independently chosen from methyl, ethyl, or isopropyl.

In another embodiment, the compound of Formula (I) has the formula:

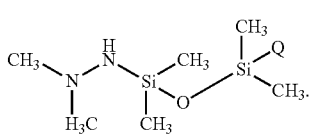

In another embodiment, the compound of Formula (I) is chosen from compounds of the formulae:

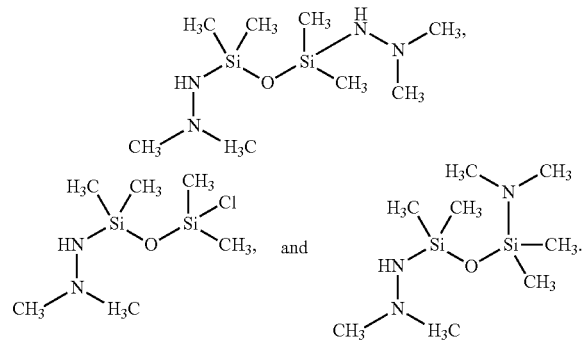

In another embodiment, the invention provides compounds having the formula:

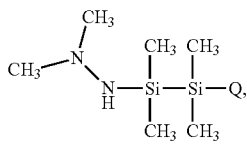

wherein Q is chloro, bromo, or iodo, or a group of the formula

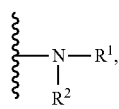

wherein $R^1$ and $R^2$ are independently chosen from $C_1$-$C_4$ alkyl, phenyl, substituted phenyl, or $C_4$-$C_6$ cycloalkyl, or can be taken together with the nitrogen atom two which they are bound to form a $C_3$-$C_5$ nitrogen containing ring.

In certain embodiments, Q is chloro.

In another embodiment, the invention provides compounds of Formula (I) having the formula

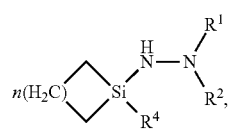

wherein $R^1$ and $R^2$ are independently chosen from $C_1$-$C_4$ alkyl, phenyl, substituted phenyl, or $C_4$-$C_6$ cycloalkyl, n is 1, 2, or 3, and $R^4$ is chosen from hydrogen, chloro, bromo, or iodo or is chosen from a group of the formula

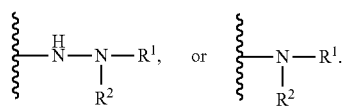

In certain embodiments, $R^1$ and $R^2$ are independently chosen from methyl, ethyl, and isopropyl. In other embodiments, n is 1.

In another embodiment, the invention provides compounds of Formula (I) having the formulae:

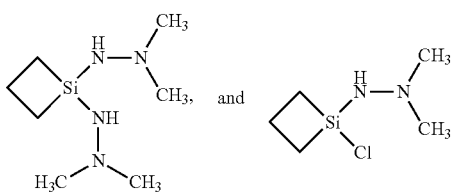

In certain embodiments, the compound of Formula (I) has less than 100 ppm, 50 ppm, or less than 10 ppm chlorine contamination.

The compounds of Formula (I) are useful as precursors for the deposition of silicon-containing films onto the surface of microelectronic devices. In certain embodiments, the films also contain nitrogen and/or oxygen and/or carbon.

Thus, in a second aspect, the invention provides a method for forming a silicon-containing film onto a surface of a microelectronic device, which comprises introducing at least one compound of Formula (I) to said surface in a reaction chamber, under vapor deposition conditions.

As used herein, the term "silicon-containing film" refers to films such as silicon dioxide, silicon nitride, silicon oxynitride, silicon carbide, silicon carbonitride, silicon oxycarbonitride, low-k thin silicon-containing films, high-k gate silicate films and low temperature silicon epitaxial films.

In certain embodiments, vapor deposition conditions comprise reaction conditions known as chemical vapor deposition, pulsed-chemical vapor deposition, and atomic layer deposition. In the case of pulsed-chemical vapor deposition, a series of alternating pulses of precursor compounds and co-reactant(s), either with or without an intermediate (inert gas) purge step, can be utilized to build up the film thickness to a desired endpoint.

In certain embodiments, the pulse time (i.e., duration of precursor exposure to the substrate) for the precursor compounds depicted above ranges between about 1 and 10 seconds. When a purge step is utilized, the duration is from about 1 to 4 seconds or 1 to 2 seconds. In other embodiments, the pulse time for the co-reactant ranges from 1 to 60 seconds. In other embodiments, the pulse time for the co-reactant ranges from about 5 to about 10 seconds.

In one embodiment, the vapor deposition conditions comprise a temperature of about 350° C. to about 750° C., and a pressure of about 1 to about 1000 Torr. In another embodiment, the vapor deposition conditions comprise a temperature of about 350° to about 650° C.

The compounds above can be employed for forming high-purity thin silicon-containing films by any suitable vapor deposition technique, such as CVD, digital (pulsed) CVD, ALD, and pulsed plasma processes. Such vapor deposition processes can be utilized to form silicon-containing films on microelectronic devices by utilizing deposition temperatures of from about 350° to about 550° C. to form films having a thickness of from about 20 angstroms to about 2000 angstroms.

In the process of the invention, the compounds above may be reacted with the desired microelectronic device substrate in any suitable manner, for example, in a single wafer CVD, ALD and/or PECVD or PEALD chamber, or in a furnace containing multiple wafers.

Alternately, the process of the invention can be conducted as an ALD or ALD-like process. As used herein, the terms "ALD or ALD-like" refers to processes such as (i) each reactant including the silicon precursor compound of Formula (I) and an oxidizing and/or reducing gas is introduced sequentially into a reactor, such as a single wafer ALD reactor, semi-batch ALD reactor, or batch furnace ALD reactor, or (ii) each reactant, including the silicon precursor compound of Formula (I) and an oxidizing and/or reducing gas is exposed to the substrate or microelectronic device surface by moving or rotating the substrate to different sections of the reactor and each section is separated by an inert gas curtain, i.e., spatial ALD reactor or roll to roll ALD reactor.

In one aspect, the invention relates to a plasma enhanced atomic layer deposition process (PEALD) process for depositing low wet etching rates and O2 ashing resistant low k thin-films using the precursors of Formula (I) as described herein, together with hydrogen plasma or nitrogen plasma. Nitrogen plasma may be useful for the formation of silicon nitride films using the compounds of Formula (I).

In general, the desired film produced using the precursor compounds of Formula (I) can be tailored by choice of each compound, coupled with the utilization of reducing or oxidizing co-reactants. See, for example, the following Scheme 1 which illustrates how the precursors of Formula (I) may be utilized in vapor deposition processes:

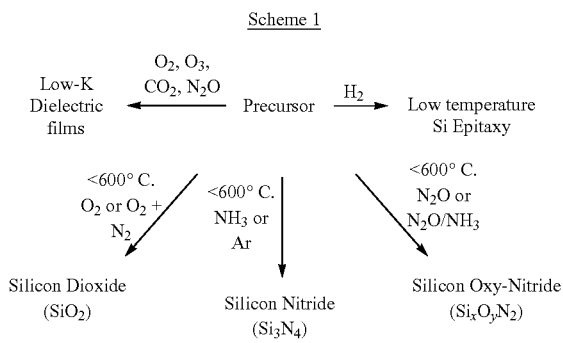

Scheme 1

Thus, in another embodiment, the vapor deposition processes above may further comprise a step involving exposing the film to a reducing gas. In certain embodiments of the present invention, the reducing gas is comprised of gases chosen from $H_2$, hydrazine ($N_2H_4$), methyl hydrazine, t-butyl hydrazine, 1,1-dimethylhydrazine, 1,2-dimethylhydrazine, and $NH_3$.

The compounds of Formula (I) are capable of low-temperature CVD and/or ALD formation of silicon-containing films. Such compounds exhibit high volatility and chemical reactivity but are stable with respect to thermal degradation at temperatures involved in the volatilization or vaporization of the precursor, allowing consistent and repeatable transport of the resulting precursor vapor to the deposition zone or reaction chamber. The chemical reactivity of the compounds of Formula (I) allows for film growth at low temperatures at which traditional silicon precursor materials such as TEOS are inert and thus, exhibit little or no deposition behavior.

In another embodiment, the vapor deposition processes may further comprise a step involving exposing the precursor to an oxidizing gas such as $O_2$, $O_3$, $N_2O$, water vapor, alcohols or oxygen plasma. In certain embodiments, the oxidizing gas further comprises an inert gas such as argon, helium, nitrogen, or a combination thereof. In another embodiment, the oxidizing gas further comprises nitrogen, which can react with the precursors of Formula (I) under plasma conditions to form silicon oxynitride films.

While using the precursor compounds of Formula (I), the incorporation of carbon and nitrogen into such films is a natural consequence of the composition of such compounds; additionally, carbon in the form of methane, ethane, ethylene or acetylene, for example, can be utilized to further introduce carbon content into the silicon-containing films, thereby producing silicon carbide.

The deposition methods disclosed herein may involve one or more purge gases. The purge gas, which is used to purge away unconsumed reactants and/or reaction by-products, is an inert gas that does not react with the precursors. Exemplary purge gases include, but are not limited to, argon, nitrogen, helium, neon, hydrogen, and mixtures thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the silicon precursor compounds, oxidizing gas, reducing gas, and/or other precursors, source gases, and/or reagents may be performed by changing the sequences for supplying them and/or changing the stoichiometric composition of the resulting dielectric film.

Energy is applied to the at least one of the silicon precursor compounds of Formula (I) and oxidizing gas, reducing gas, or combination thereof to induce reaction and to form the silicon-containing film on the microelectronic device substrate. Such energy can be provided by, but not limited to, thermal, pulsed thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively, a remote plasma-generated process in which plasma is generated 'remotely' of the reaction zone and substrate, being supplied into the reactor.

As used herein, the term "microelectronic device" corresponds to semiconductor substrates, including 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metal oxide semiconductor (nMOS) and/or a positive channel metal oxide semiconductor (pMOS) transistor and will eventually become a microelectronic device or microelectronic assembly. Such microelectronic devices contain at least one substrate, which can be chosen from, for example, silicon, $SiO_2$, $Si_3N_4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, germanium, germanium-containing, boron-containing, Ga/As, a flexible substrate, porous inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

Certain of the compounds of Formula (I) can be prepared by starting with a dichloro compound of the formula:

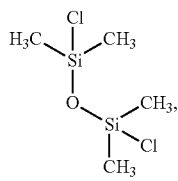

and reacting such compound with various amines and azido compounds.

Other compounds of Formula (I) can be prepared starting with cyclotrimethylene dichlorosilane as the primary reactant with various amines and azido compounds as per the following flow diagram:

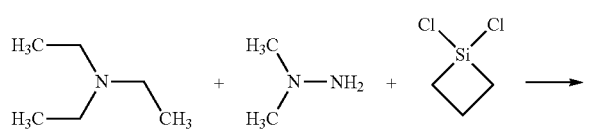

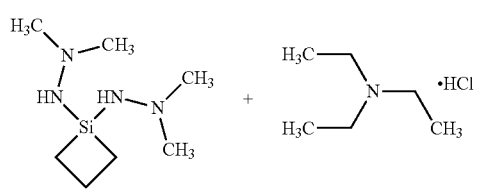

This invention can be further illustrated by the following examples of certain embodiments thereof, although it will be understood that these examples are included merely for purposes of illustration and are not intended to limit the scope of the invention unless otherwise specifically indicated.

EXAMPLES

Example 1

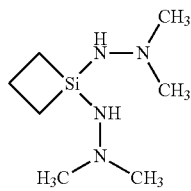

CTMDCS (cyclotrimethylene dichlorosilane) (1 g, 7.08 mmol) was placed into a 20 mL glass vial. Pentane (2 mL) was added, followed by TEA (triethylamine) (1.3 g, 12.8 mmol). To the resulting cloudy solution was added UDMH (unsymmetrical dimethyl hydrazine) (1.1 g, 16.6 mmol) dropwise. A very exothermic reaction occurred, and a thick precipitate formed immediately. The solids were extracted with 10 mL diethylether, and the combined extracts were filtered and the volatiles were removed under reduced pressure resulting in light yellow oil ~0.5 g, 80% purity.

The crude was analyzed by NMR. The 29Si NMR analysis showed a single major silicon species, and the product was confirmed by 13C and 1H NMR. The overall purity of the crude was approximately 80%. The product could be further purified by short path distillation to obtain high purity, semiconductor grade material.

NMR Analysis:
$^1$H NMR (C6D6): δ 1.58 (t, 4H, CH2), 1.90 (m, 2H, CH2), 2.27 (s, 12H, NN(CH3)2);
$^{13}$C {1H} NMR(C6D6): δ 13.6 (CH2), 22.7 (CH2), 52.5 (CH3);
$^{29}$Si NMR (C6D6): δ −11.49

Example 2

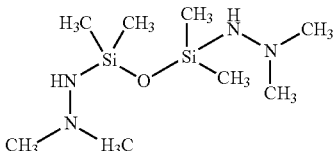

In a 1 L three neck round bottom flask equipped with a magnetic stir bar, a thermocouple adapter, and a temperature read out, 1,3-dichloro-tetramethyl-disiloxane (10 g, 49.2 mmol) was dissolved in pentane (200 mL) (T1=24.1° C.). To the clear solution was added TEA (11 g, 108 mmol). A slightly clouded reaction mixture formed (T1=25.3° C.). To the resulting reaction mixture was added UDMH (6.5 g, 108 mmol) as a solution in diethyl ether (5 mL). UDMH solution was added dropwise over a period of 10 mins (~1 mL/min). Immediate fuming was observed, and a dense precipitate formed in the head space. After 5 mins of addition, a large amount of precipitate was observed. The reaction mixture was allowed to stand for an additional 2 hours followed by filtration through a coarse filter. The salts were washed twice with 50 mL hexanes. The combined washings were subjected to vacuum distillation and volatiles were removed down to 1.2 Torr at room temperature. The resulting cloudy viscous oil was filtered and analyzed by 1H, 13C and 29Si NMR. Yield 7.2 g, ~90% pure. Yield 58% crude. While no further purification was attempted, electronic grade material can be obtained by further purification by distillation.
NMR Analysis:
$^1$H NMR (C6D6): δ 0.25 (s, 12H, Si—CH3), 2.21 (bs, 2H, NH), 2.29 (s, 12H, NN(CH3)2);
$^{13}$C {1H} NMR(C6D6): δ −0.74 (Si—CH3), 52.4 (N—CH3);
29Si NMR (C6D6): δ −16.16

Example 3

CTMDCS (1 g, 7.08 mmol) was placed into a 20 mL glass vial. Pentane (2 mL) was added, followed by TEA (1.3 g, 12.8 mmol). To the resulting cloudy solution was added UDMH (1.1 g, 16.6 mmol) dropwise. A very exothermic reaction occurred, and a thick precipitate formed immediately. The solids were extracted with 10 mL diethylether, and the combined extracts were filtered and the volatiles were removed under reduced pressure resulting in light yellow oil ~0.5 g, 80% purity.
The crude was analyzed by NMR. The $^{29}$Si NMR analysis showed a single major silicon species. The product was confirmed by $^{13}$C and $^1$H NMR. The overall purity is approximately 80%.
NMR Analysis:
$^1$H NMR (C$_6$D$_6$): δ 1.58 (t, 4H, CH$_2$), 1.90 (m, 2H, CH$_2$), 2.27 (s, 12H, NN(CH$_3$)$_2$);
$^{13}$C {$^1$H} NMR(C$_6$D$_6$): δ 13.6 (CH$_2$), 22.7 (CH$_2$), 52.5 (CH$_3$);
$^{29}$Si NMR (C$_6$D$_6$): δ −11.49

Example 4—Synthesis of 2-(2-chloro-1,1,2,2-te-tramethyldisilan-1-yl)-1,1-dimethylhydrazine

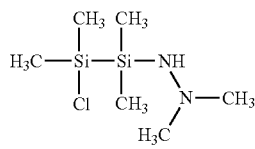

A 10 L reactor equipped with a mechanical overhead stirrer, a thermocouple probe, a temperature read out and a nitrogen gas inlet adapter, a solvent feed line (⅜" PTFE tubing), a separate 3/8" PTFE tubing for charging reagent and filtration, was dried and purged with nitrogen. A 5 L filter funnel was leak checked down to 80 mT and purged with nitrogen overnight.
Cl$_2$Me$_4$Si$_2$ (100 g, 534 mmol) and TEA (114 g) were combined in a 1 L flask inside a glovebox. Some fuming occurred, and the solution turned slightly cloudy. A solution of UDMH (64.2 g, 81.2 mL) in diethyl ether (~220 mL) was prepared in a 500 mL liquid addition funnel. The reactor was charged with 2.5 L hexanes and cooled down to −4° C. The chiller was set to −10° C. The Cl$_2$Me$_4$Si$_2$ and TEA mixture (neat) was charged under the flow of nitrogen using ⅜" PTFE tubing. An additional amount of hexanes (~500 mL) was added. The mixture was allowed to stir under nitrogen. The addition funnel containing UDMH in ether (310 mL solution) was mounted on the reactor under the flow of nitrogen. The UDMH solution was added drop wise over a period of 45 mins at the rate of ~6.8 mL/min. While keeping the reaction temperature below 0° C., the reaction mixture was stirred overnight at room temperature followed by filtration through 5 L fritted filter funnel. The solids were washed twice with hexanes (500 mL), and the solvent was removed under reduced pressure down to 4.8 Torr at −21.1° C. The resulting colorless oil was transferred into a 3 neck round bottom flask for further purification. The titled compound was identified as a major intermediate product by 1H NMR, 13C NMR and 29Si NMR.
NMR Analysis:
$^1$H NMR (C6D6): δ 0.22 (s, 6H, Si—CH3), 0.49 (s, 6H, Si—CH3), 1.89 (bs, 1H, NH), 2.12 (s, 6H, NN(CH3)2);
$^{13}$C {1H} NMR(C6D6): δ −1.8, 2.7 (Si—CH3), 52.4 (N—CH3);
$^{29}$Si NMR (C6D6): δ −9.1, 19.4.

Example 5

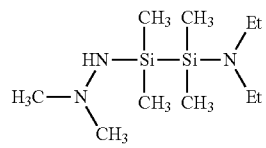

The partially substituted intermediate (2-(2-chloro-1,1,2,2-tetramethyldisilan-1-yl)-1,1-dimethylhydrazine) (0.21 g, 1 mmol) (as synthesized in Example 4) could be further reacted with a stochiometric amount of diethylamine (0.73 g, 1 mmol) in presence of triethylamine (0.101 g, 1 mmol) in hexanes (20 mL). The resulting slurry would be filtered and the volatiles removed under reduced pressure to obtain the titled compound. The product could be further purified by distillation.

Example 6—PEALD Silicon Nitride Deposition Using and Ar/N2 Plasma (Prophetic)

A silicon containing film is deposited using a silicon precursor of Formula (I) and Ar/N$_2$ plasma as a co-reactant gas, with the process conditions as described in the Table below.

| | |
|---|---|
| Reactor Pressure | 2 T |
| Process Temperature | 250-700° C. |
| Carrier Gas | Ar (at 300 sccm) |
| Plasma Power | 300 Watts |
| Plasma | Nitrogen |
| Pulse Sequence | (i) Silicon precursor for 20 seconds; (ii) purge with inert gas for 20 seconds; (iii) nitrogen plasma for 15 seconds; and (iv) purge with inert gas for 20 seconds. |

Example 7—PEALD Silicon Oxide Deposition Using and Ar/O$_2$ Plasma

A silicon containing film could be deposited using a silicon precursor of Formula (I) and Ar/O$_2$ plasma as a co-reactant, with the process conditions as described in Table below.

| | |
|---|---|
| Reactor Pressure | 2 T |
| Process Temperature | 250-700° C. |
| Carrier Gas | Ar (at 100 sccm) |
| Plasma Power | 250 Watts |
| Plasma | Nitrogen |

| | |
|---|---|
| Pulse Sequence | (i)Silicon precursor for 20 seconds; (ii) purge with inert gas for 20 seconds; (iii) oxygen plasma for 15 seconds; and (iv) purge with inert gas for 20 seconds. |

Example 8—CVD Deposition

The vaporization and introduction of a compound of Formula (I) into a CVD chamber could be accomplished with mild heating to 40° C. at 40 Torr. The precursor could be dispersed through a circular showerhead to provide uniform delivery to the heated substrate. A mixture of nitrogen, oxygen ($O_2$) and nitrous oxide ($N_2O$) would be expected to co-reacted at the substrate, containing areas of metal, silicon and silicon nitride, and a film of SiCOx would be deposited at 450° C. for 10 minutes. This precursor and process is expected to deposit a uniform, highly conformal coating over the structured substrate, with the desired dielectric properties and excellent wet etch resistance. This film is expected to show a minor increase in wet etch resistance after ashing in an $O_2$ plasma for 30 seconds.

Example 9—PECVD Disposition

The vaporization and introduction of a compound of Formula (I) 1 into a PE-CVD chamber could be accomplished with mild heating at 35° C. at 1 Torr. The precursor could be dispersed through a circular showerhead to provide uniform delivery into the direct argon plasma (250 Watts). A mixture of nitrogen and ammonia ($NH_3$) co-reactants could also be introduced into the plasma and would be expected to result in gas-phase dissociation of the precursor and deposition of a SiCNx film onto the heated substrate (300° C.). The substrate is expected to be comprised of high-aspect ratio patterns of metal and dielectric features, and the deposited film is expected to display acceptable conformality over the features. This precursor and process is expected to deposit a compositionally uniform film over the entire patterned substrate, and to exhibit acceptable wet etch resistance, both before and after plasma ashing in $O_2$.

The invention has been described in detail with particular reference to certain embodiments thereof, but it will be understood that variations and modifications can be affected within the spirit and scope of the invention.

The invention claimed is:

1. A compound of Formula (I):

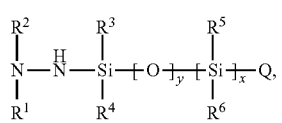

wherein $R^1$ and $R^2$ are independently chosen from $C_1$-$C_4$ alkyl, phenyl, substituted phenyl, or $C_4$-$C_6$ cycloalkyl, or can be taken together with the nitrogen atom to which they are bound to form a $C_3$-$C_5$ nitrogen containing ring; $R^3$ and $R^4$ are independently chosen from hydrogen or $C_1$-$C_4$ alkyl, or are taken together with the Si atom to which they are bound to form a $C_3$-$C_5$ silicon-containing ring; and $R^5$ and $R^6$ are independently chosen from hydrogen or $C_1$-$C_4$ alkyl;

Q is chosen from bromo, iodo, or a group of the formula

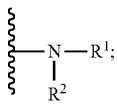

and x is 1, and (i) y is 0, or (ii) y is 1.

2. The compound of claim 1, wherein each of $R^1$, $R^2$, $R^3$, $R^4$, $R^5$ and $R^6$ are independently chosen from methyl, ethyl, or isopropyl.

3. The compound of claim 1, wherein the compound has the formula:

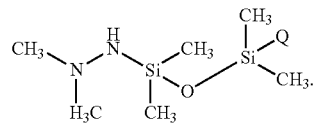

4. The compound of claim 3, chosen from:

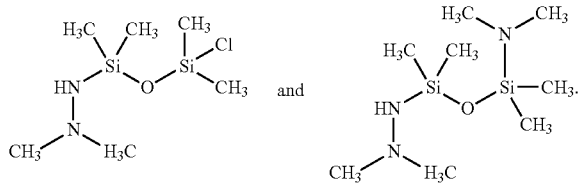

5. The compound of claim 1, wherein the compound has the formula:

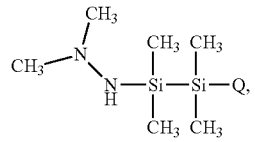

wherein Q is chloro, bromo, or iodo, or a group of the formula

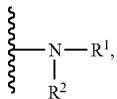

wherein $R^1$ and $R^2$ are independently chosen from $C_1$-$C_4$ alkyl, phenyl, substituted phenyl, or $C_4$-$C_6$ cycloalkyl, or can be taken together with the nitrogen atom two which they are bound to form a $C_3$-$C_5$ nitrogen containing ring.

6. The compound of claim 5, wherein Q is chloro.

7. The compound of claim 5, wherein Q is a group of the formula

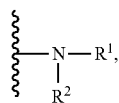

and wherein $R^1$ and $R^2$ are methyl.

8. A compound having the formula:

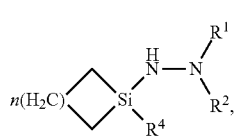

wherein $R^1$ and $R^2$ are independently chosen from $C_1$-$C_4$ alkyl, phenyl, substituted phenyl, or $C_4$-$C_6$ cycloalkyl, n is 1, 2, or 3, and $R^4$ is chloro, bromo, or iodo or is chosen from a group of the formula

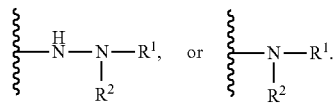

9. The compound of claim 8, wherein $R^1$ and $R^2$ are independently chosen from hydrogen, methyl, ethyl, and isopropyl.

10. The compound of claim 8, wherein n is 1.

11. The compound of claim 8, chosen from compounds of the formulae:

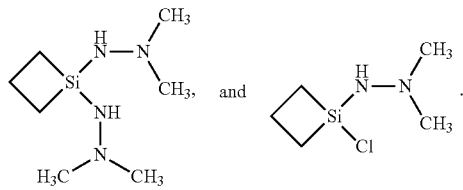

12. A method for forming a silicon-containing film on the surface of a microelectronic device, which comprises introducing, to said surface in a reaction chamber, under vapor deposition conditions, at least one compound of Formula (I)

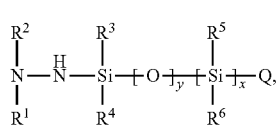

(I)

wherein $R^1$ and $R^2$ are independently chosen from $C_1$-$C_4$ alkyl, phenyl, substituted phenyl, or $C_4$-$C_6$ cycloalkyl, or can be taken together with the nitrogen atom to which they are bound to form a $C_3$-$C_5$ nitrogen containing ring; $R^3$ and $R^4$ are independently chosen from hydrogen or $C_1$-$C_4$ alkyl, or are taken together with the Si atom to which they are bound to form a $C_3$-$C_5$ silicon-containing ring; and $R^5$ and $R^6$ are independently chosen from hydrogen or $C_1$-$C_4$ alkyl;

Q is chosen from chloro, bromo, iodo, or a group of the formula

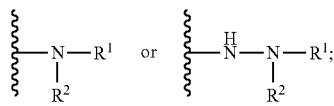

and x is 0 or 1, and (i) y is 0, provided that when y is 0, Q is other than a group of the formula

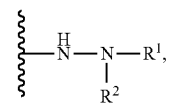

or (ii) y is 1 when x is 1.

13. The method of claim 12, wherein the vapor deposition conditions are chosen from chemical vapor deposition (CVD), atomic layer deposition (ALD), plasma-enhanced ALD (PEALD), plasma enhanced cyclical chemical vapor deposition (PECCVD), a flowable chemical vapor deposition (FCVD), a plasma-enhanced ALD-like process, or an ALD process.

14. The method of claim 12, wherein said silicon-containing film is chosen from silicon dioxide, silicon nitride, silicon oxynitride, silicon carbide, silicon carbonitride, silicon oxycarbonitride, low-k thin silicon-containing films, high-k gate silicate films and low temperature silicon epitaxial films.

15. The method of claim 12, wherein the surface is chosen from silicon dioxide, silicon nitride, aluminum oxide, aluminum nitride, aluminum, tungsten, copper, cobalt, molybdenum, ruthenium, a silicon wafer, or combinations thereof.

16. The method of claim 12, wherein the surface is silicon dioxide.

17. The method of claim 12, wherein the surface is aluminum oxide.

18. The method of claim 12, wherein the substrate comprises a metal chosen from aluminum, copper, tungsten, molybdenum, cobalt, or ruthenium.

* * * * *